United States Patent [19]
Tanaka et al.

[11] Patent Number: 6,036,782
[45] Date of Patent: Mar. 14, 2000

[54] SHOWER HEAD

[75] Inventors: Sumi Tanaka; Sakae Nakatsuka; Mitsuhiro Tachibana, all of Yamanashi-ken, Japan

[73] Assignee: Tokyo Electron Limited, Tokyo, Japan

[21] Appl. No.: 09/166,577

[22] Filed: Oct. 6, 1998

[30] Foreign Application Priority Data

Oct. 7, 1997 [JP] Japan ................................. 9-290504

[51] Int. Cl.[7] .................................................. C23C 16/00
[52] U.S. Cl. ............................................................ 118/715
[58] Field of Search ................................................ 118/715

[56] References Cited

U.S. PATENT DOCUMENTS 5,766,364  6/1998  Ishida ...................................... 118/715
5,785,796  7/1998  Lee ........................................... 118/715

*Primary Examiner*—Richard Bueker
*Attorney, Agent, or Firm*—Oblon, Spivak, McClelland, Maier & Neustadt, P.C.

[57] ABSTRACT

A showerhead for use in a process chamber for performing a predetermined process on an object, designed to apply a prescribed gas in the process chamber. The showerhead comprises a main body, a cover, and a support. The main body has a an internal space into which the gas to be supplied into the process chamber is introduced and an opening which opens to the process chamber. The cover closes the opening of the main body and has a plurality of gas-applying holes for applying the gas from the main body. The support supports the cover to the main body and provides a predetermined clearance between the cover and the main body.

13 Claims, 4 Drawing Sheets

SHOWER HEAD

BACKGROUND OF THE INVENTION

The present invention relates to a showerhead for applying gas in the process chamber of a process apparatus designed to perform a specific process on objects such as semiconductor wafers.

Processing apparatus for performing processes on semiconductor wafers to manufacture semiconductor integrated circuits are generally classified into two types. The first type is designed to process a number of wafers at a time. The second type is designed to process wafers one by one, at high speed. There is the trend that the second-type process apparatus is used in the case where the wafers are large and metal films are to be formed on the wafers. This is because the second-type process apparatus can form metal films of uniform thickness.

The second-type process apparatus comprises a process chamber, a table (susceptor), a heater (or a heating lamp), and a showerhead. The process chamber is shaped like, for example, a cylinder, and can be evacuated. The table is provided in the process chamber, for supporting one object to be processed (e.g., semiconductor wafers). The heater is located below the table, for heating the object placed on the table. The showerhead is arranged on the ceiling section of the process chamber and above the table, for applying a process gas to the single object mounted on the table.

In operation, the showerhead applies the process gas to the objects, while the heater is heating the object at a prescribed process temperature. A process is thereby performed on the object to form, for example, a film on the object.

FIGS. 8 and 9 show a conventional showerhead 2. As shown in FIG. 8, the showerhead 2 comprises a main body 6 and a cover 12. The main body 6 is connected to the ceiling section 4 of a process chamber and extends downward from the ceiling section 4. The main body 6 has an opening 6A in its lower end. The cover 12 has a number of gas-applying holes 10. The cover 12 is secured by bolts 14 to the lower end of the main body 6, closing the opening 6A. As seen from FIG. 9, the lower end of the main body 6 defines a large contact surface 16. It is at this surface 16 that the main body contacts the showerhead cover 12. The ceiling section 4 of the process chamber (i.e., the top of the main body 6) has a gas inlet port 8 for guiding the process gas into the showerhead 2.

The process gas is introduced through the gas inlet port 8 into the showerhead 6. The gas is then guided into the process chamber through the gas-applying holes 10. It is thereby applied into the process chamber in substantially uniform distribution. To apply the gas into the chamber more uniformly, a gas-dispersing plate 11 may be provided in the showerhead 2.

In order to manufacture semiconductor integrated circuits on the semiconductor wafer at a high yield, it is vitally important to heat the surface of the semiconductor wafer uniformly and to reduce particles on the surface of the semiconductor wafer. Many particles are formed, however, when the showerhead 2 is used to apply the process gas into the process chamber. As the temperature in the process chamber rises and falls, friction occurs between the main body 6 and cover 12 of the showerhead 2 at the contact surface 16 due to the difference in thermal expansion coefficient between the body 6 and the cover 12. Since the contact surface 16 is large as mentioned above, particles are inevitably formed in great quantities.

To decrease the friction between them, both the main body 6 and the cover 12 may be made of aluminum-based materials to have almost the same thermal expansion coefficient. Even in this case, friction between the body 6 and the cover 12 is unavoidable because the cover 12 thermally expands more than the main body 6. Namely, the cover 12, which is located near the heater, is heated to a higher temperature than the main body 6. The inventors hereof experimented with a conventional showerhead comprising a cover having a diameter of about 28 cm. The results of the experiment showed that friction had occurred over a distance of about 3 mm on the contact surface between the main body and cover of this showerhead.

To prevent friction at the contact surface 16 between the main body 6 and cover 12 of the showerhead 2 (FIG. 8), packing made of Teflon® is interposed between the main body 6 and the cover 12. Teflon has but low corrosion resistance; it cannot last sufficiently long to prevent forming of particles.

The wires and electrodes incorporated in semiconductor devices now have widths in the order of sub-micron, e.g., 0.2 to 0.5 µm, since the devices have become smaller and yet their integration density has increased. It is now strongly demanded that measures be taken to reduce particles on the surface of a semiconductor wafer being processed.

BRIEF SUMMARY OF THE INVENTION

The object of the present invention is to provide a showerhead in which forming of particles can be inhibited.

To attain the object of the invention, there is provided a showerhead for use in a process chamber for performing a predetermined process on an object. The showerhead is designed to apply a prescribed gas in the process chamber. The showerhead comprises: a main body having an internal space into which the gas to be supplied into the process chamber is introduced and an opening which opens to the process chamber; a cover closing the opening of the main body and having a plurality of gas-applying holes for applying the gas from the main body; and support means supporting the cover to the main body and providing a predetermined clearance between the cover and the main body.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of this invention will be described, with reference to the accompanying drawings.

Figure 1:
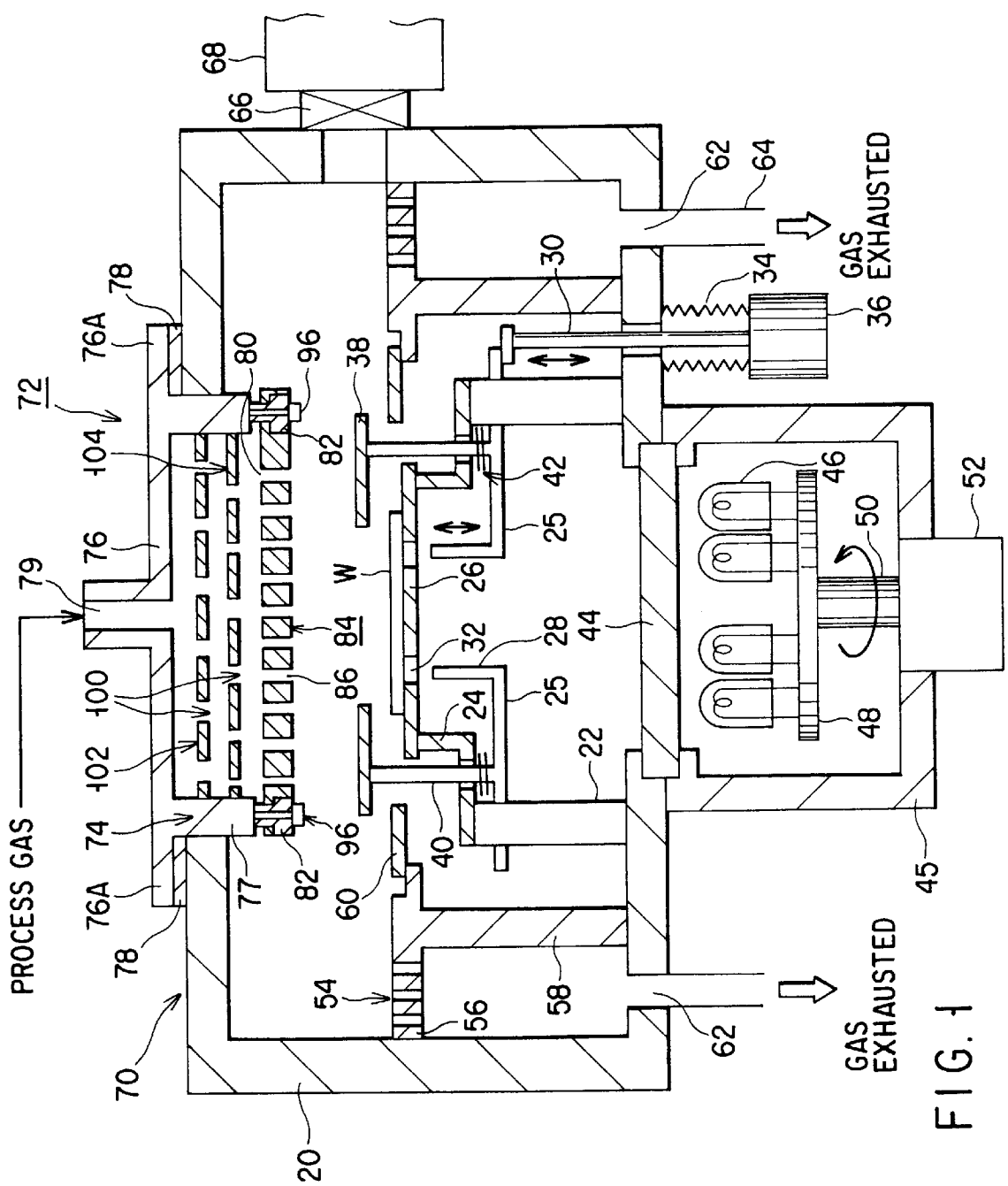
FIG. 1 is a sectional view of a process apparatus having a showerhead according to a first embodiment of the present invention.

FIG. 1 shows a process apparatus for forming a film on an object. The apparatus has a process chamber 20 shaped like a hollow cylinder or a box. The process chamber 20 is made of aluminum or the like, with an alumite layer formed on its surfaces. The process chamber 20 is located adjacent to a load-lock chamber 68. A gate valve 66 is provided in one side of the process chamber 20. A transfer arm (not shown) transfers a semiconductor wafer W, which is an object to be processed, from the load-lock chamber 68 through the gate valve 66 into the process chamber 20. Only one wafer W is processed in the chamber 20.

A table (susceptor) 26 is provided in the process chamber 20 for holding the semiconductor wafer W. The table 26 is secured to support members 24, which have an L-shaped cross section. The support members 24 are connected to posts 22 which extend upwards from the bottom of the process chamber 20. The posts 22 and support members 24 are made of transcalent material such as quartz. The table 26 is made of carbon material or aluminum alloy and has a thickness of about 1 mm.

A plurality of lifter pins 28 (three pins in the present embodiment) are provided below the table 26. The table 26 has a plurality of holes 32 (three in the present embodiment). The holes 32 allow passage of the lifter pins 28. The lifter pins 28 are supported by pin supports 25 and extend upward therefrom. The pin supports 25 are attached to the upper end of a pushing rod 30. The pushing rod 30 penetrates the bottom of the process chamber 20. The lower end of the rod 30 is connected an actuator 36, which is located below the process chamber 20. Bellows 34 are interposed airtightly between the process chamber 20 and the actuator 36. The lower part of the pushing rod 30 extends through the bellows 34.

When the actuator 36 drives the pushing rod 30 upwards, the lifter pins 28 protrude from the upper surface of the table 26, passing through the holes 32 of the table 26, thereby to lift the wafer W from the table 26. Conversely, when the actuator 36. drives the pushing rod 30 downwards, the lifter pins 28 recedes to a position below the table 26, passing through the holes 32 of the table 26, thereby to place the wafer W onto the table 26.

A clamp ring 38 is provided around the table 26, for positioning the wafer W on the table 26. The clamp ring 38 is made of ceramics. The clamp ring 38 is connected to the upper ends of support rods 40, which loosely pass through the holes made in the support members 24. The lower ends of the support rods 40 are connected to the pin supports 25. Hence, the clamp ring 38 is moved up and down, together with the lifter pins 28. Coil springs 42 are wound around the support rods 40, each interposed between one support member 24 and one pin support 25. The coil springs 42 help the clamp ring 38 to move downwardly and clamp the wafer W reliably. It should be noted that the lifter pins 28 and pin supports 25 are made of transcalent material such as quartz.

A transcalent window 44 is made in the bottom of the process chamber 20 and located right below the table 26. The window 44 is made of transcalent material such as quartz. The junction between the window 44 and the bottom of the chamber 20 is made airtight. A heating chamber 45, which is shaped like a box, is connected to the lower surface of the process chamber 20 and located below the transcalent window 44. The heating chamber 45 contains a plurality of heating lamps 46 and a turntable 48. The lamps 46, which are used as heating means, are mounted on the turntable 48. The turntable 48, which functions as a reflector, too, is connected by a shaft 50 to an electric motor 52. The heat rays emitted by the lamps 46 pass through the transcalent window 44. As the turntable 48 is rotated, the heat rays are uniformly applied to the lower surface of the table 26. The table 26 is thereby heated.

A gas-guiding ring 56 surrounds the table 26. The ring 56 has a plurality of gas-guiding holes 54. A hollow cylinder 58 supports the gas-guiding ring 56. An annular attachment 60 made of quartz is arranged inside in the gas-guiding ring 56. The attachment 60 is supported by the cylinder 58. The attachment 60 contacts the outer circumferential surface of the clamp ring 38, preventing the process gas from flowing into a space below the clamp ring 38.

The bottom of the process chamber 20 has exhaust ports 62, which are located below the gas-guiding ring 56. The exhaust ports 62 are connected to exhaust pipes 64 connected to a vacuum pump (not shown). A vacuum can therefore be maintained at a predetermined level in the process chamber 20.

A showerhead 72 is mounted on the ceiling section 70 of the process chamber 20, for introducing process gas or cleaning gas into the process chamber 20. The showerhead 72 opposes the table 26. The showerhead 72 comprises a main body 74 and a cover 84. The main body 74 is generally a cylindrical container and has an internal space into which the gas to be supplied into the process chamber is introduced. The cover 84 is a disc having a number of gas-applying holes 86. The main body 74 is made of aluminum or the like and comprises a hollow cylinder 77 and a ceiling plate 76. The ceiling plate 76 closes the upper end of the hollow cylinder 77. The lower end of the cylinder 77 remains open, defining an opening 80. The hollow cylinder 77 is fitted from above, in an opening made in the ceiling section 70 of the process chamber 20. A spacer 78 is interposed between the inner edge of the ceiling section 70 and the flange 76A of the ceiling plate 76, achieving airtight sealing between the process chamber 20 and the showerhead 72. The ceiling plate 76 has a gas inlet port 79 for guiding the process gas or the like into the main body 74. Gas-dispersing plates 102 and 104, each having a plurality of gas-dispersing holes 100, are provided in the main body 74.

Figure 2:
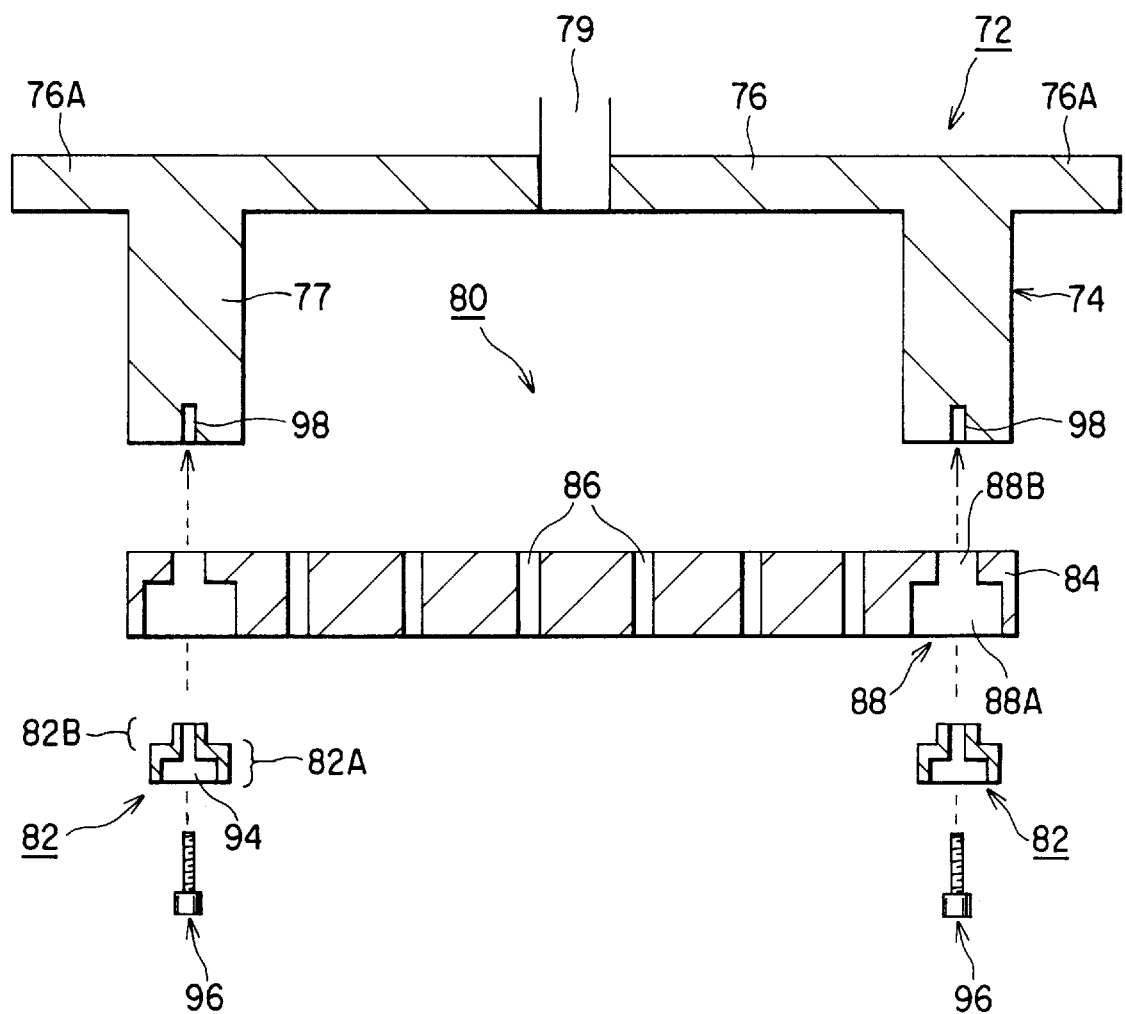
FIG. 2 is an exploded sectional view of the showerhead incorporated in the process apparatus.
Figure 3:
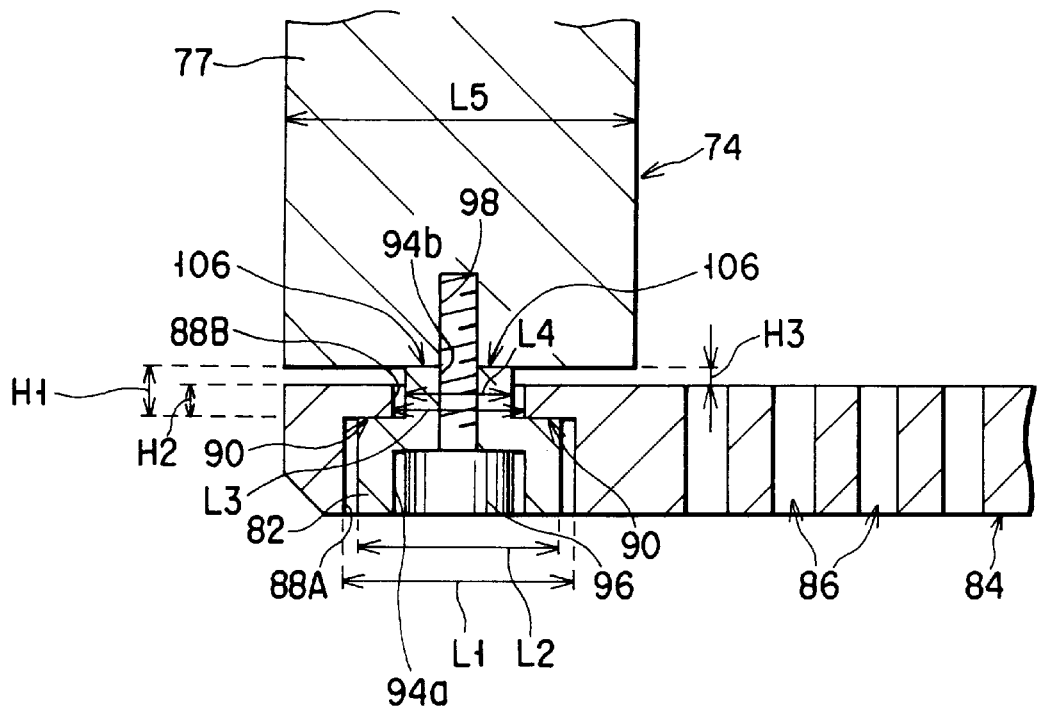
FIG. 3 is an enlarged sectional view showing the junction between the main body and the cover of the showerhead.
Figure 4:
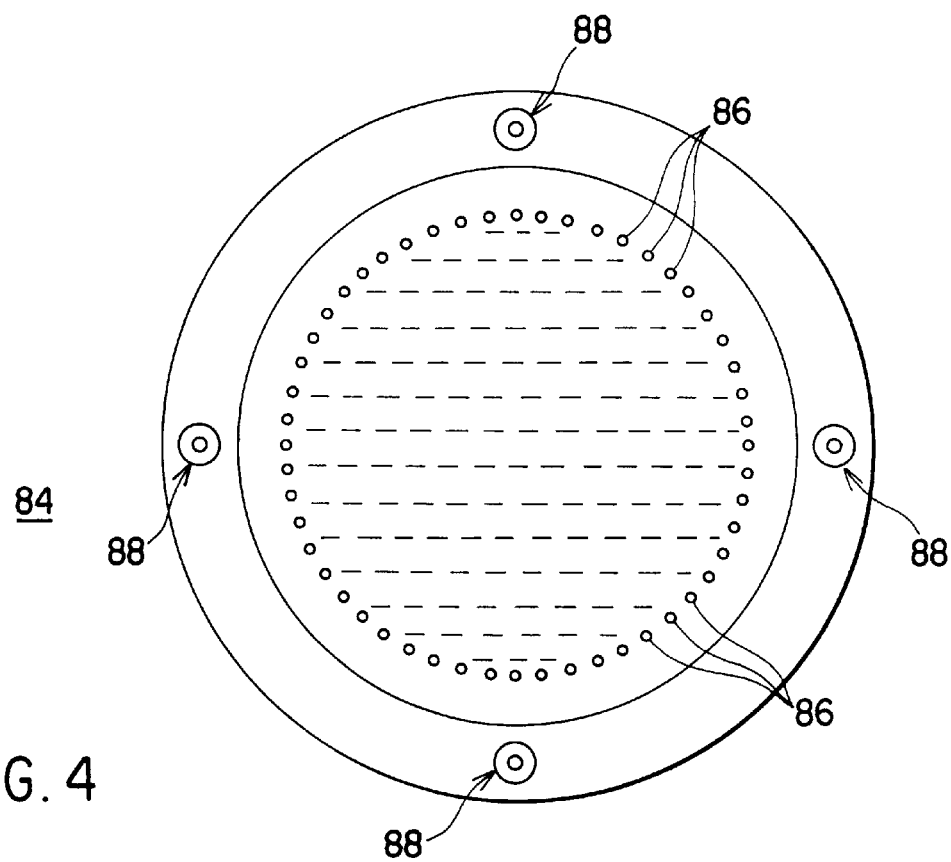
FIG. 4 is a plan view of the cover of the showerhead.

As FIGS. 2 and 3 show in detail, the cover 84 is secured to the lower end of the main body 74 by collars (support members) 82 and bolts 96, thus closing the opening 80. The cover 84 is made of aluminum and has alumite layers formed on its surfaces. As shown in FIG. 4, the gas-applying holes 86 made in the cover 84 have a diameter of about 1 mm, and four through holes 88 are made in the edge portion of the cover 84. The holes 88 are spaced apart equidistantly in the circumferential direction of the cover 84. Each through hole 88 is a circular stepped hole, consisting of a lower hole 88A and an upper hole 88B smaller than the lower hole 88A. As shown in FIG. 2, the collars 82 are loosely fitted in the through holes 88 of the cover 84. The number of through holes 88 is not limited to four. As shown in FIG. 3, the hollow cylinder 77 of the main body 74 has a wall thickness L5 of about 30 mm.

Figure 5:
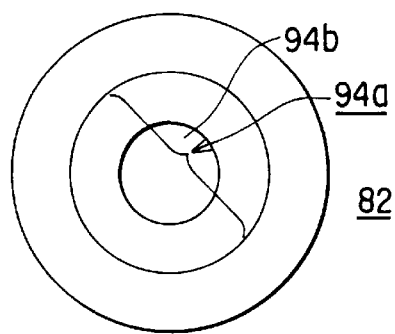
FIG. 5 is a bottom view of the collar used in the showerhead.
Figure 6:
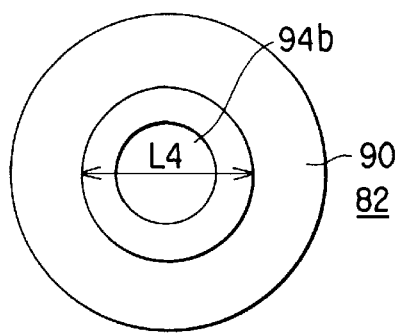
FIG. 6 is a top view of the collar.
Figure 7:
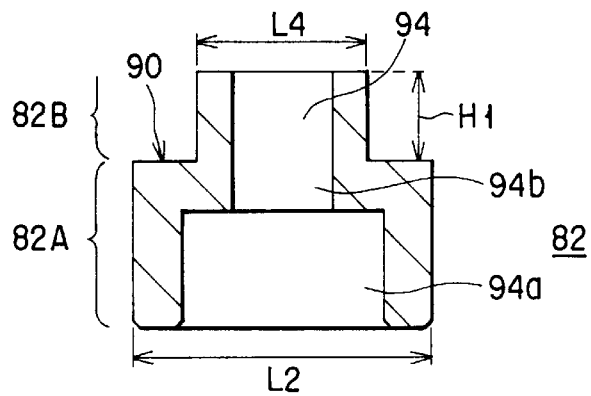
FIG. 7 is a sectional view of the collar.
Figure 8:
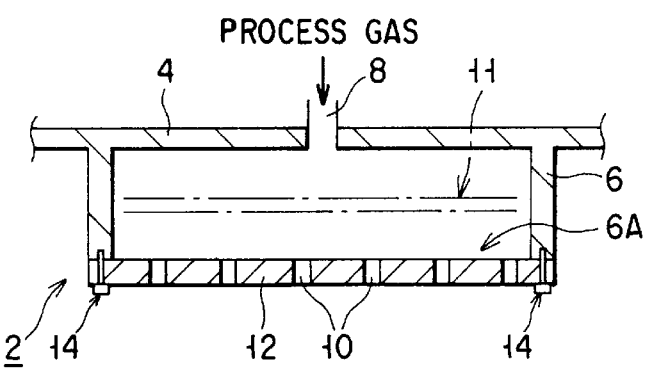
FIG. 8 is a sectional view showing a conventional showerhead.
Figure 9:
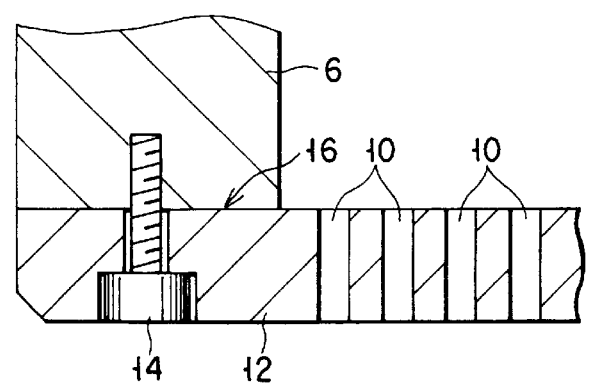
FIG. 9 is an enlarged sectional view showing the junction between the main body and cover of the showerhead.

As shown in FIGS. 5 to 7, each collar 82 is a stepped column. More precisely, the collar 82 is comprised of a lower column 82A and an upper column 82B thinner than the lower column 82A. A step 90 is formed at the junction between the columns 82A and 82B. The step 90 defines a shoulder of the collar 82. The collar 82 has a through hole 94 extending in the axial direction. The through hole 94 is a circular one, consisting of a lower hole 94a and an upper hole 94b smaller than the lower hole 94a. It is in the lower hole 94a that the head of the bolt 96 is provided.

As shown in FIG. 3, the lower hole 88A of each through hole 88 made in the cover 84 has a diameter L1 slightly larger than the diameter L2 of the lower column 82A of each collar 82. The upper hole 88B of the through hole 88 has a diameter L3 a little larger than the diameter L4 of the upper column 82B of the collar 82. To be more specific, L1=14 mm, L2=12 mm, L3=7 mm, and L4=4 mm. Hence, each collar 82 is loosely inserted in one through hole 88, and a clearance is provided between the collar 82 and the inner side wall of the through hole 88. The upper column 82B of each collar 82 has a height H1 greater than the length H2 of he upper hole 88B of each through hole 88. The upper column 82B therefore protrudes a little from the upper surface of the cover 84 when the collar 82 is completely inserted into the through hole 88.

In the showerhead 72, the collars 82 and bolts 96 are made of metal which is harder and more resistant to corrosion than aluminum. More precisely, they are made of, for example, nickel-chromium alloy such as Inconel (trade name) or Hastelloy (trade name).

As shown in FIG. 3, the collars 82 are secured to the main body 74 of the showerhead 72 when the bolts 96 inserted in the through holes 94 are set into screw holes 98 which are made in the lower end of the main body 74 as shown in FIG. 2. Once the bolts 96 are thus set in the screw holes 98, the cover 84 is secured to the main body 74 of the showerhead 72. The cover 84 contacts the steps 90 of the collars 82, and a clearance extending horizontally is provided between the cover 84 and the collars 82. That is, the cover 84 does not contact the main body 74 of the showerhead 72. Rather, the upper columns 82B of the collars 82, which protrude from the upper surface of the cover 84, contact the main body 74 at a contact surface 106 only. It is desired that the clearance H3 between the main body 74 and the cover 84 (i.e., the height of that portion of each upper column 82B which protrudes upwards from the upper surface of the cover 84) be within a range from about 0.1 mm to about 0.3 mm. Thanks to this clearance H3, the main body 74 and the cover 84 will not contact each other when they undergo thermal expansion. Since the clearance H3 is so small, the gas leaks through it but in a minimal amount.

It will be describe how the process apparatus shown in FIG. 1 operates to process a wafer W.

First, the gate valve 66 is opened, and the transfer arm transfers a wafer W into the process chamber 20. In the process chamber 20, the wafer W is transferred from the transfer arm onto the lifter pins 28 which have been protruded upwards from the upper surface of the table 26 by the pushing rods 30. Then, the pushing rods 30 are lowered, moving the lifter pins 28 down. As a result, the wafer W is placed on the table 26. As the rods 30 are further lowered, the clamp ring 38 moves downwards, pushing the peripheral edge of the wafer W. The wafer W is thereby held on the table 26.

Thereafter, the heating lamps 46 heat the wafer W at a predetermined process temperature. Process gas is introduced from the gas inlet port 79 into the process chamber 20 through the showerhead 72. Having been evacuated, the process chamber 20 maintains a prescribed process pressure.

In the showerhead 72, the process gas is diffused as it flows downwards through the gas-diffusing holes 100 of the gas-dispersing plates 102 and 104. The process gas passes through the gas-applying holes 86 of the cover 84 and uniformly applied to the upper surface of the wafer W. At this time, the main body 74 and cover 84 of the showerhead 72 are heated with the heat radiated from the table 26 and the wafer W. The main body 74 and the cover 84 will be heated to 400 to 600° C. if the process is to form a film on the wafer W. Consequently, both the main body 74 and the cover 84 thermally expand. When the main body 74 and cover 84 are cooled, they will contract. Nonetheless, no friction occurs between the main body 74 and the cover 84 because they are spaced from each other by the collars 82, not contacting each other at all, as shown in FIG. 3. Hence, no particles are generated at the junction between the main body 74 and cover 84 of the showerhead 72.

As indicated above, the collars 82 contact the main body 74 at the contact surfaces 106. However, each contact surface 106 is far smaller than in the contact surface 16 at which the cover 12 contacts the lower end of the main body 6 in the conventional showerhead 2 as shown in FIG. 2. In addition, since the showerhead 72 has only four collars 82, the total area at which the collars 82 contact the main body 74 is much smaller than the area of the lower surface of the showerhead 74. Therefore, particles could be generated but in far smaller numbers than in the conventional showerhead 2, when friction occurs between the main body 74 and the collars 82 as the main body 74 and the cover 84 thermally expand or contract.

The inventors hereof made a showerhead according to the present invention, incorporated the same in a process apparatus designed to form a film on a semiconductor wafer, and operated the apparatus, thereby forming a film on the wafer. Then, they overhauled the showerhead and examined the lower end of the main body 74 of the showerhead under a microscope. A trace of friction was scarcely observed on the lower end of the main body 74.

As described above, the uniform clearance H3 (FIG. 3) between the main body 74 and the cover 84 is only about 0.1 mm to about 0.3 mm. Since the clearance H3 is so small, the amount of gas leaking through the clearance H3 is far smaller than the amount of gas flowing through the gas-applying holes 86 of the cover 84. This leakage of gas would not impair the uniform application of gas to the wafer W.

Since the cover 84 is supported at the steps 90 of the collars 82, only its weight acts on the collars 82. In other words, the cover 84 is suspended by the collars 82 from the main body 74. Further, a predetermined horizontal clearance is provided between each collar 82 and the cover 84. The cover 84 can slide on the steps 90 of the collars 82 as much as this clearance allows. Hence, the cover 84 slides on the steps 90 when it thermally expands or contracts. (The cover 84 can so slide because it is not secured by bolts to the main body 74.) Friction between the cover 84 and the collars 82 is not so intense as to generate particles. For the purpose of inhibiting friction between the cover 84 and the collars 82, it is desired that the steps 90 of the collars 82 be subjected to MCP (Mechanical Chemical Polishing).

Moreover, the collars 82 excel in durability and corrosion resistance, because they are made of Inconel or Hastelloy which is a nickel-chromium alloy harder than aluminum.

The showerhead 72 described above is one incorporated in a film-forming process apparatus having heating lamps. Nonetheless, the showerhead can be used in any other process apparatus that performs heat treatment and that needs to have a showerhead. Needless to say, the showerhead can be employed in a plasma process apparatus. Furthermore, the showerhead can be used not only in a process apparatus for processing a semiconductor wafer, but also in a process apparatus for processing an LCD substrate, a glass substrate or the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A showerhead for use in a process chamber for performing a predetermined process on an object, designed to apply a prescribed gas in the process chamber, said showerhead comprising:
   a main body having an internal space into which the gas to be supplied into the process chamber is introduced and an opening which opens to the process chamber;
   a cover closing the opening of the main body and having a plurality of gas-applying holes for applying the gas from the main body; and
   support means supporting the cover to the main body and providing a predetermined clearance between the cover and the main body.

2. A showerhead according to claim 1, wherein the support means comprises a plurality of support members secured to the main body, at least one of said support members having a part which supports the cover in sliding contact therewith.

3. A showerhead according to claim 2, wherein the cover has a peripheral portion and a plurality of through holes made in the peripheral portion, the support members are inserted in the through holes, respectively, and a predetermined clearance is provided between the inner side wall of the each through hole and the support member inserted in the through hole.

4. A showerhead according to claim 2, wherein each of the support members is secured to the main body by a bolt passing through the support member.

5. A showerhead according to claim 2, wherein the main body and the cover are made of material including aluminum, and the support members are made of nickel-chromium alloy.

6. A process apparatus comprising:
   a process chamber for performing a predetermined process on an object; and
   a showerhead for applying a prescribed gas in the process chamber, said showerhead comprising:
      a main body having an internal space into which the gas to be supplied into the process chamber is introduced and an opening which opens to the process chamber;
      a cover closing the opening of the main body and having a plurality of gas-applying holes for applying the gas from the main body; and
      support means supporting the cover to the main body and providing a predetermined clearance between the cover and the main body.

7. A process apparatus according to claim 6, wherein the support means comprises a plurality of support members secured to the main body, at least one of said support members having a part which supports the cover in sliding contact therewith.

8. A process apparatus according to claim 7, wherein the cover has a peripheral portion and a plurality of through holes made in the peripheral portion, the support members are inserted in the through holes, respectively, and a predetermined clearance is provided between the inner side wall of the each through hole and the support member inserted in the through hole.

9. A process apparatus according to claim 7, wherein each of the support members is secured to the main body by a bolt passing through the support member.

10. A process apparatus according to claim 7, wherein the main body and the cover are made of material including aluminum, and the support members are made of nickel-chromium alloy.

11. A showerhead for use in a process chamber for performing a predetermined process on an object, designed to apply a prescribed gas in the process chamber, said showerhead comprising:
    a main body having an internal space into which the gas to be supplied into the process chamber is introduced and an opening which opens to the process chamber; and
    a cover provided at the opening of the main body and having gas-applying holes for applying the gas from the main body,
    wherein the cover is suspended from the main body by a plurality of support means provided on a lower surface of the main body, in which the opening is made, and a substantially uniform clearance is provided between the cover and the lower surface of the main body.

12. A showerhead according to claim 11, wherein each of the support means has a stage supporting the cover and allowing the cover to slide for a distance falling within a predetermined range.

13. A showerhead according to claim 11, wherein said support means support the cover by virtue of only a weight of the cover which is acting on the support means.

* * * * *